US012243593B2

(12) United States Patent
Yang et al.

(10) Patent No.: US 12,243,593 B2
(45) Date of Patent: Mar. 4, 2025

(54) LOW POWER READ METHOD AND A MEMORY DEVICE CAPABLE THEREOF

(71) Applicant: SanDisk Technologies LLC, Addison, TX (US)

(72) Inventors: Xiang Yang, Santa Clara, CA (US); Deepanshu Dutta, Fremont, CA (US); Ohwon Kwon, Milpitas, CA (US); James Kai, Fremont, CA (US); Yuki Mizutani, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 325 days.

(21) Appl. No.: 17/685,613

(22) Filed: Mar. 3, 2022

(65) Prior Publication Data
US 2023/0282288 A1 Sep. 7, 2023

(51) Int. Cl.
*G11C 16/24* (2006.01)
*G11C 16/04* (2006.01)
*G11C 16/26* (2006.01)
*G11C 16/08* (2006.01)

(52) U.S. Cl.
CPC .......... *G11C 16/26* (2013.01); *G11C 16/0483* (2013.01); *G11C 16/24* (2013.01); *G11C 16/08* (2013.01)

(58) Field of Classification Search
None
See application file for complete search history.

(56) References Cited

U.S. PATENT DOCUMENTS

| 5,315,541 | A  | * | 5/1994 | Harari | G11C 16/0491 |
| | | | | | 257/E27.103 |
| 5,777,922 | A | * | 7/1998 | Choi | H10B 69/00 |
| | | | | | 365/185.23 |
| 7,313,023 | B2 | * | 12/2007 | Li | G11C 16/24 |
| | | | | | 365/207 |
| 10,734,080 | B2 | * | 8/2020 | Chibvongodze | H10B 43/35 |
| 10,854,619 | B2 | * | 12/2020 | Chibvongodze | H10B 41/50 |
| 2006/0203587 | A1 | * | 9/2006 | Li | G11C 16/24 |
| | | | | | 365/207 |
| 2013/0258772 | A1 | * | 10/2013 | Lee | G11C 16/0425 |
| | | | | | 365/185.03 |

* cited by examiner

*Primary Examiner* — Hoai V Ho
*Assistant Examiner* — Justin Bryce Heisterkamp
(74) *Attorney, Agent, or Firm* — Dickinson Wright PLLC; Damian M. Aquino

(57) ABSTRACT

The memory device includes a chip with circuitry, a plurality of memory blocks, and a plurality of bit lines. The memory blocks include an array of memory cells, and the circuitry either overlies or underlies the array of memory cells. The bit lines are divided into two portions that are electrically connected with one another via at least one transistor so that at least one portion of each bit line can be charged independently of the other portion of the same bit line.

6 Claims, 17 Drawing Sheets

LOW POWER READ METHOD AND A MEMORY DEVICE CAPABLE THEREOF

BACKGROUND

1. Field

The present technology relates to the operation of memory devices and, more particularly, to a memory device with a chip that is configured to perform a read operation with reduced power consumption.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

In many memory devices, a chip includes circuitry including sense amplifiers, an array of memory cells contained within memory blocks, and bit lines that are coupled to the memory blocks. To read the data contained in the memory cells, in many memory devices, the sense amplifiers are charged to charge voltages and then discharged through the memory cells being read to detect a threshold voltage of each the memory cell being read. This sensing operation commonly involves charging all of the bit lines of the chip, which may be a power and time-consuming process.

SUMMARY

One aspect of the present disclosure is related to a memory device that includes a chip with circuitry, a plurality of memory blocks, and a plurality of bit lines. The memory blocks include an array of memory cells, and the circuitry either overlies or underlies the array of memory cells. The bit lines are divided into two portions that are electrically connected with one another via at least one transistor so that at least one portion of each bit line can be charged independently of the other portion of the same bit line.

According to another aspect of the present disclosure, each bit line has a first portion on one side of the at least one transistor and a second portion on an opposite side of the at least one transistor.

According to yet another aspect of the present disclosure, the circuitry includes a plurality of sense amplifiers that are in electrical communication with the bit lines, and some of the sense amplifiers are electrically connected with the first portions of some of the plurality of bit lines and some of the sense amplifiers are electrically connected with the second portions of some of the plurality of bit lines.

According to still another aspect of the present disclosure, the memory device further includes a controller that is configured to put the at least one transistor in an off condition so only one portion of some of the bit lines is charged during a sensing operation when only some of the data of one of the memory blocks is requested.

According to a further aspect of the present disclosure, the controller is further configured to put the at least one transistor in an on condition so that both portions of each bit line are charged when certain data that cannot be accessed by only charging one portion of some of the bit lines is requested.

According to yet a further aspect of the present disclosure, a bit line hook up couples each portion of each bit line to the at least one transistor.

According to still a further aspect of the present disclosure, the circuitry includes a plurality of sense amplifiers.

According to another aspect of the present disclosure, the circuitry is located vertically below the plurality of memory blocks.

Another aspect of the present disclosure is related to a method of operating a memory device. The method includes the step of preparing a chip including circuitry, a plurality of memory blocks, and a plurality of bit lines. The memory blocks contain an array of memory cells, and the circuitry overlies or underlies the array of memory cells. The bit lines are divided into two portions that are electrically connected with one another via at least one transistor so that at least one portion of each bit line can be charged independently of the other portion of the same bit line. The method continues with the step of receiving a command to sense the data contained in one memory block of the plurality of memory blocks. In response to the command being to sense less than all of the data in the memory block to be sensed, then with the at least one transistor in an off condition, the method proceeds with the step of charging only one portion of some of the bit lines.

According to another aspect of the present disclosure, in response to the command being to sense all of the data in the memory block to be sensed, then with the at least one transistor in an on condition, the method continues with the step of charging both portions of each bit line.

According to yet another aspect of the present disclosure, each bit line has a first portion on one side of the at least one transistor and a second portion on an opposite side of the at least one transistor.

According to still another aspect of the present disclosure, the circuitry includes a plurality of sense amplifiers that are in electrical communication with the bit lines. Some of the sense amplifiers are electrically connected with the first portions of some of the plurality of bit lines, and some of the sense amplifiers are electrically connected with the second portions of some of the plurality of bit lines.

According to a further aspect of the present disclosure, the circuitry is located vertically below the plurality of memory blocks.

According to yet a further aspect of the present disclosure, the circuitry includes a plurality of sense amplifiers with each sense amplifier being electrically coupled with one of the bit lines.

According to still a further aspect of the present disclosure, a bit line hook up couples each portion of each bit line to the at least one transistor.

Yet another aspect of the present disclosure is related to a memory device that includes a chip with circuitry, a plurality of memory blocks, and a plurality of bit lines. The memory blocks include an array of memory cells, and the circuitry overlies or underlies the array of memory cells. The bit lines are divided into two portions that are electrically connected with one another via at least one transistor so that at least one portion of each bit line can be charged independently of the other portion of the same bit line. The memory device further includes a sensing means for selectively turn on the at least one transistor to electrically connect the two portions of the bit lines and turn off the at least one transistor to electrically isolate the two portions of the bit lines.

According to another aspect of the present disclosure, each bit line has a first portion on one side of the at least one transistor and a second portion on an opposite side of the at least one transistor.

According to yet another aspect of the present disclosure, the circuitry includes a plurality of sense amplifiers that are in electrical communication with the bit lines. Some of the sense amplifiers are electrically connected with the first portions of some of the plurality of bit lines, and some of the sense amplifiers are electrically connected with the second portions of some of the plurality of bit lines.

According to still another aspect of the present disclosure, the sensing means is configured to put the at least one transistor in an off condition so only one portion of some of the bit lines is charged during a sensing operation when only some of the data of one of the memory blocks is requested.

According to a further aspect of the present disclosure, the sensing means is further configured to put the at least one transistor in an on condition so that both portions of each bit line are charged when certain data that cannot be accessed by only charging one portion of some of the bit lines is requested.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which.

DETAILED DESCRIPTION

According to an aspect of the present disclosure, a plurality of bit lines in a chip are physically separated form one another into two portions that are joined together via a transistor so that the portions can either be electrically connected with one another or electrically isolated from one another. By turning off the transistors to electrically isolated the portions of the bit lines from one another, during certain read operations, only some portions of some of the bit lines can be charged, as opposed to all portions of all bit lines. This allows for improved performance and reduced power consumption during those read operations. In other read operations, all portions of all bit lines can still be charged by turning on the transistors to electrically connect the portions of the bit lines with one another. Thus, the functionality of the chip is not compromised.

Figure 1A:
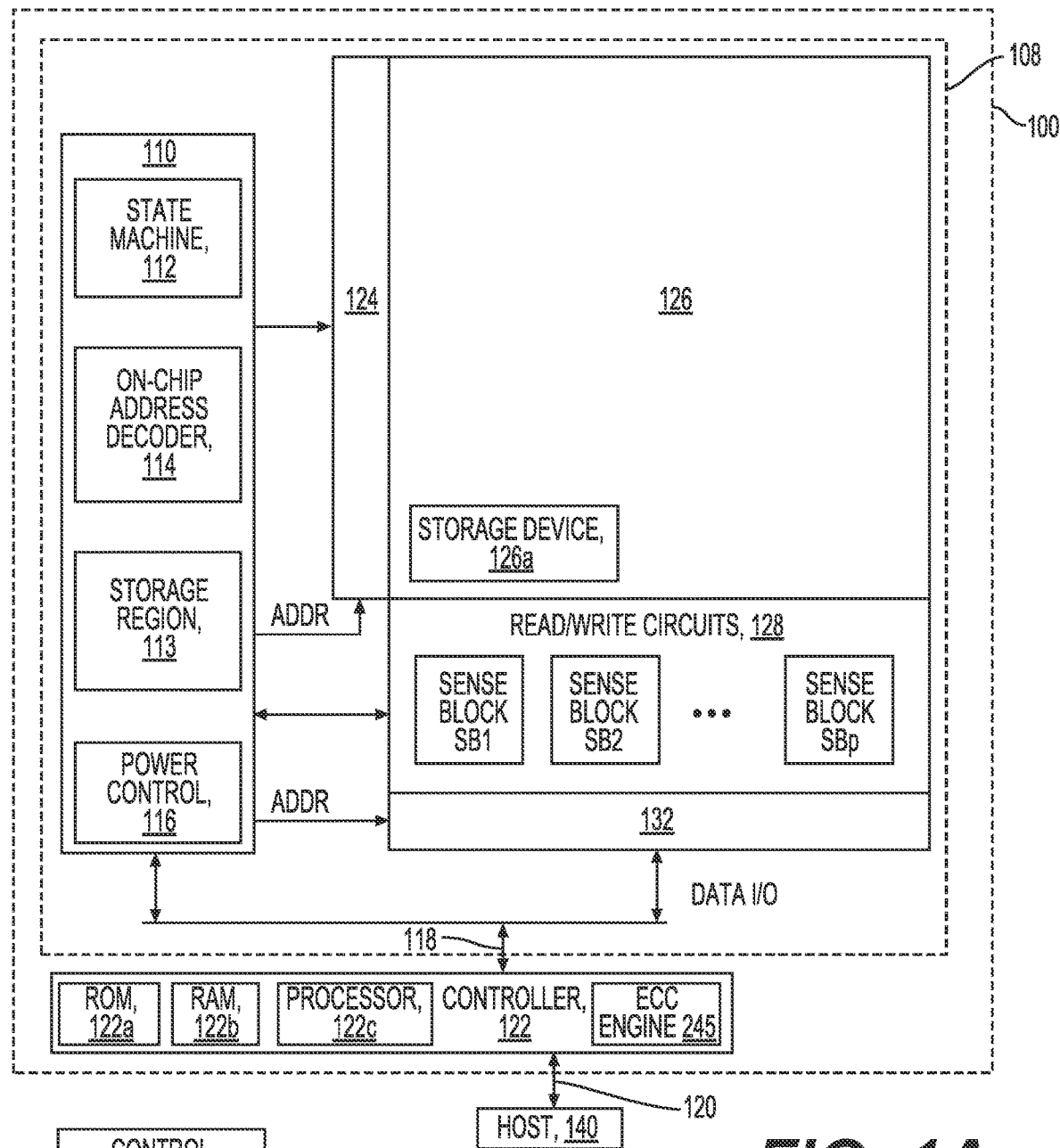
FIG. 1A is a block diagram of an example memory device.

FIG. 1A is a block diagram of an example memory device includes the chip design that is capable of conducting the improved sensing techniques that are discussed in further detail below. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
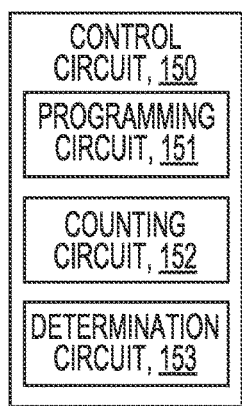
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
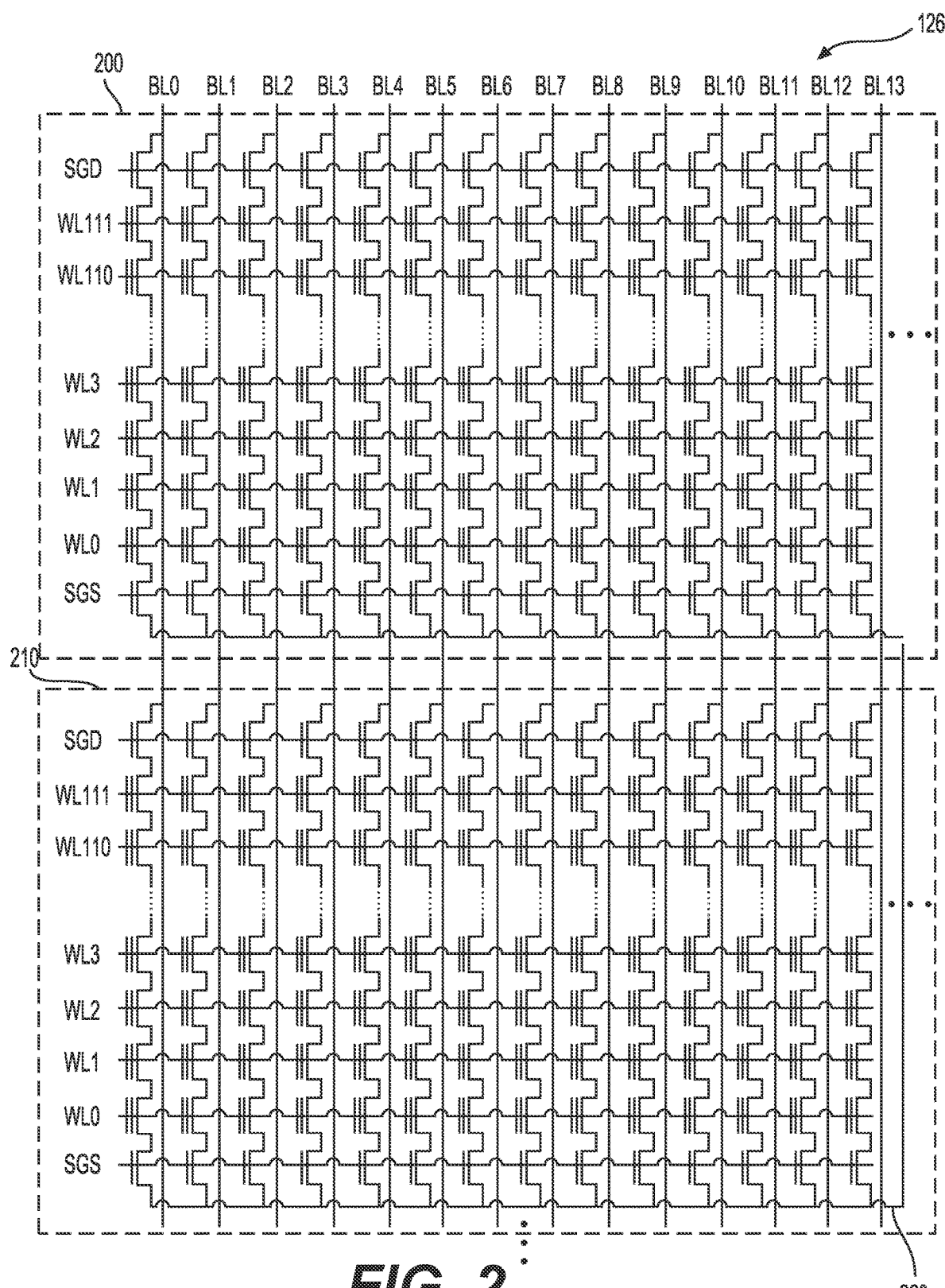
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
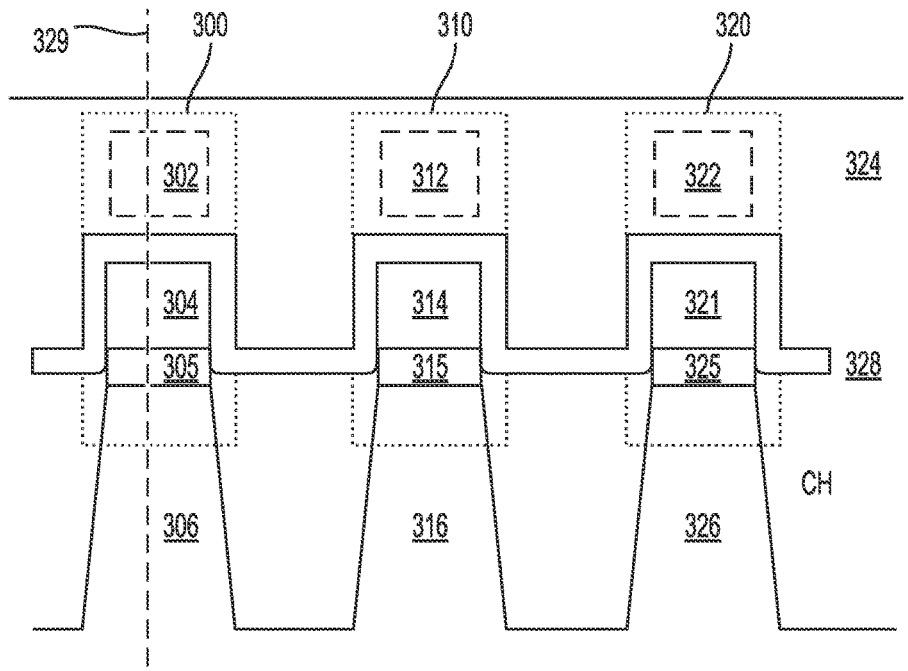
FIG. 3A and FIG. 3B depict cross-sectional views of example floating gate memory cells in NAND strings.
Figure 3B:
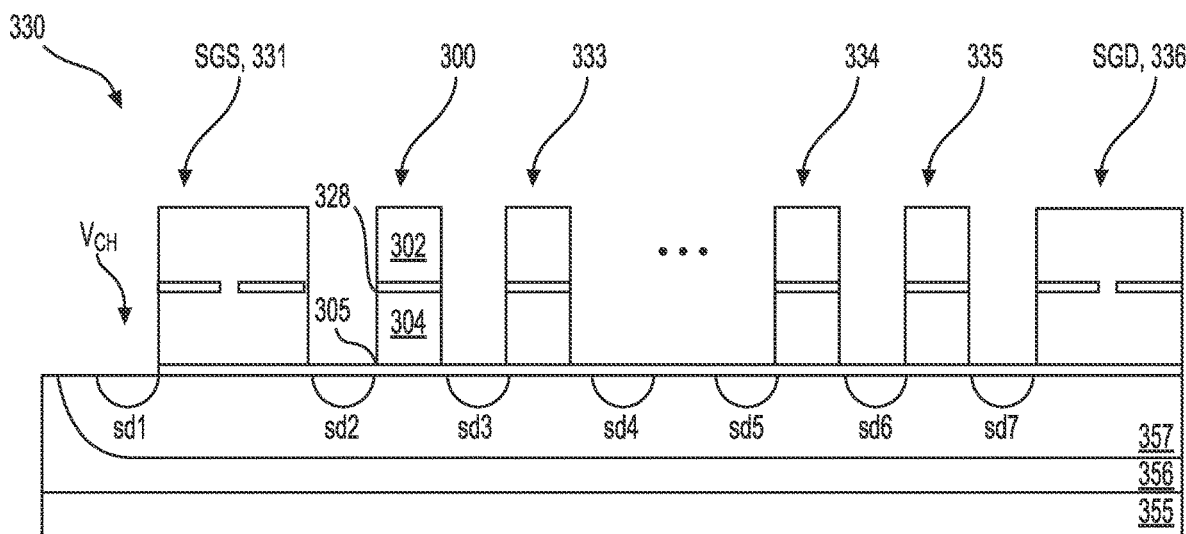

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
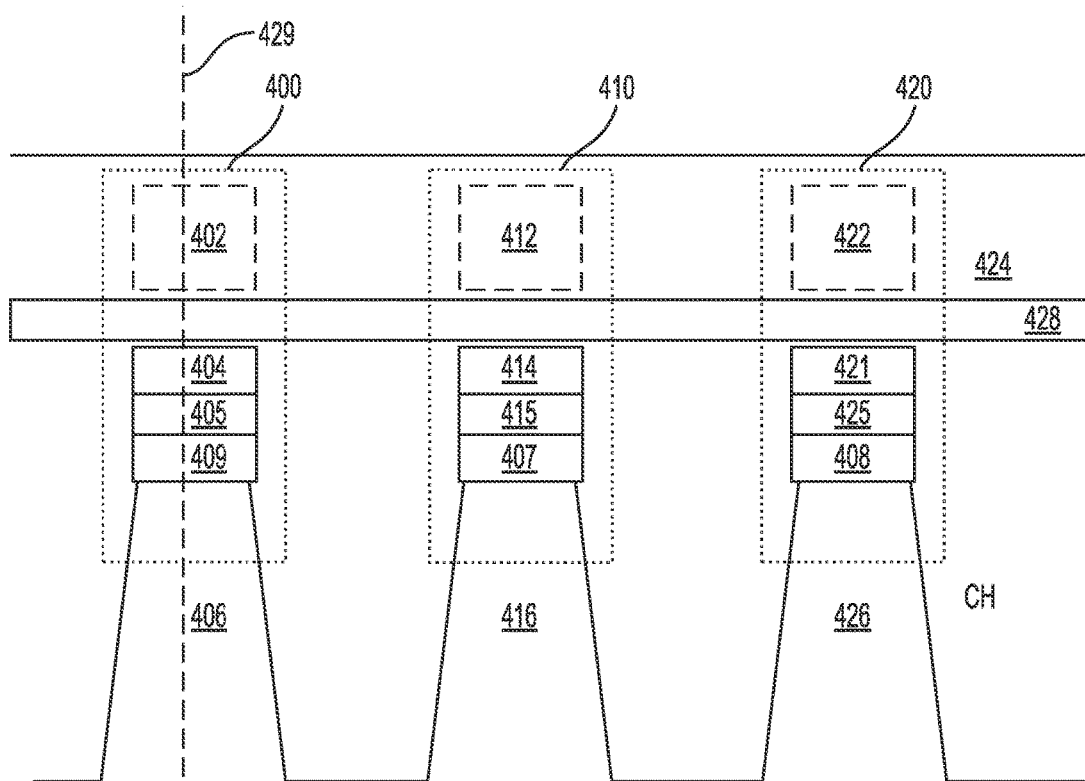
FIG. 4A and FIG. 4B depict cross-sectional views of example charge-trapping memory cells in NAND strings.
Figure 4B:
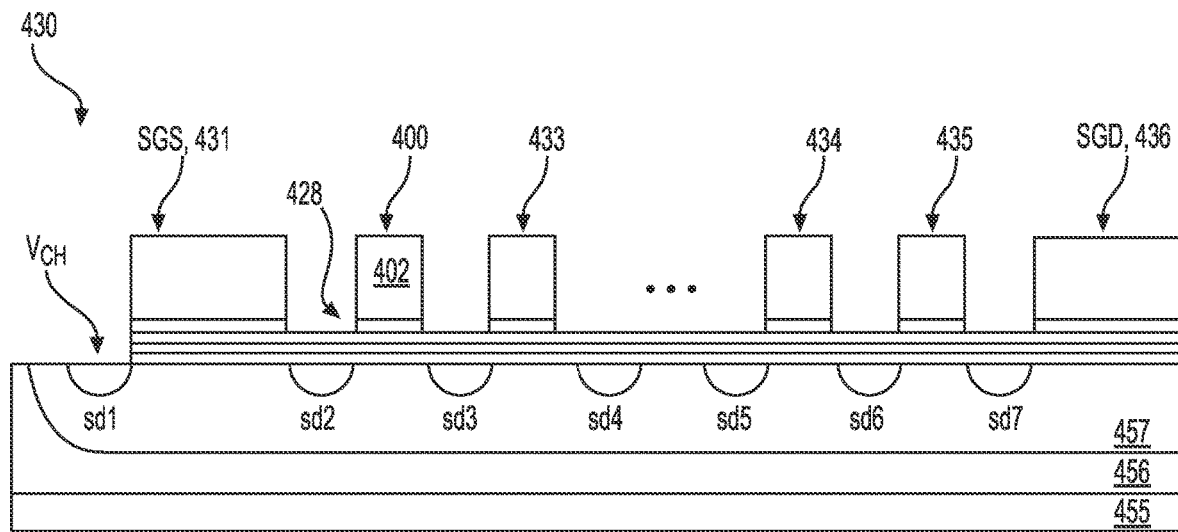

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
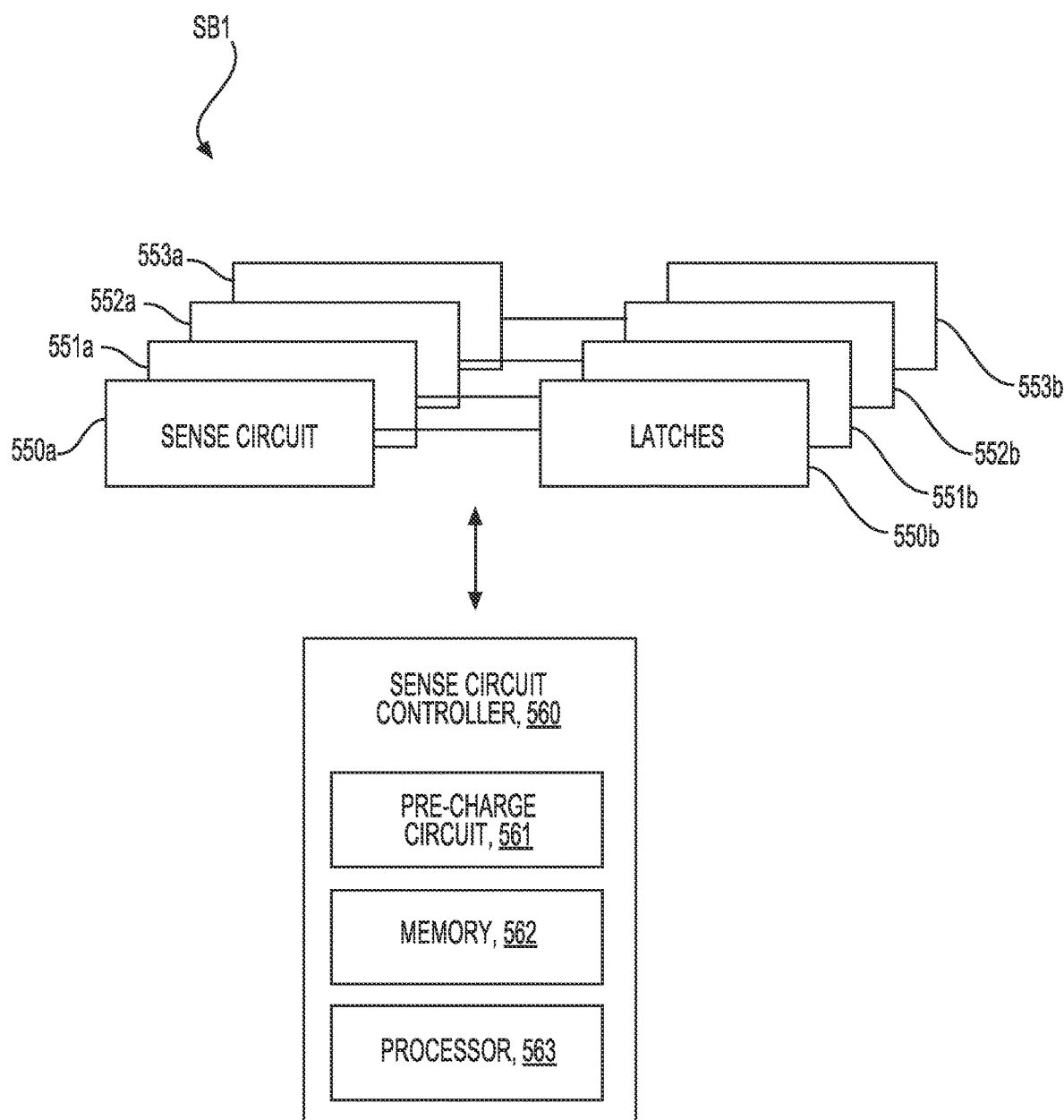
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
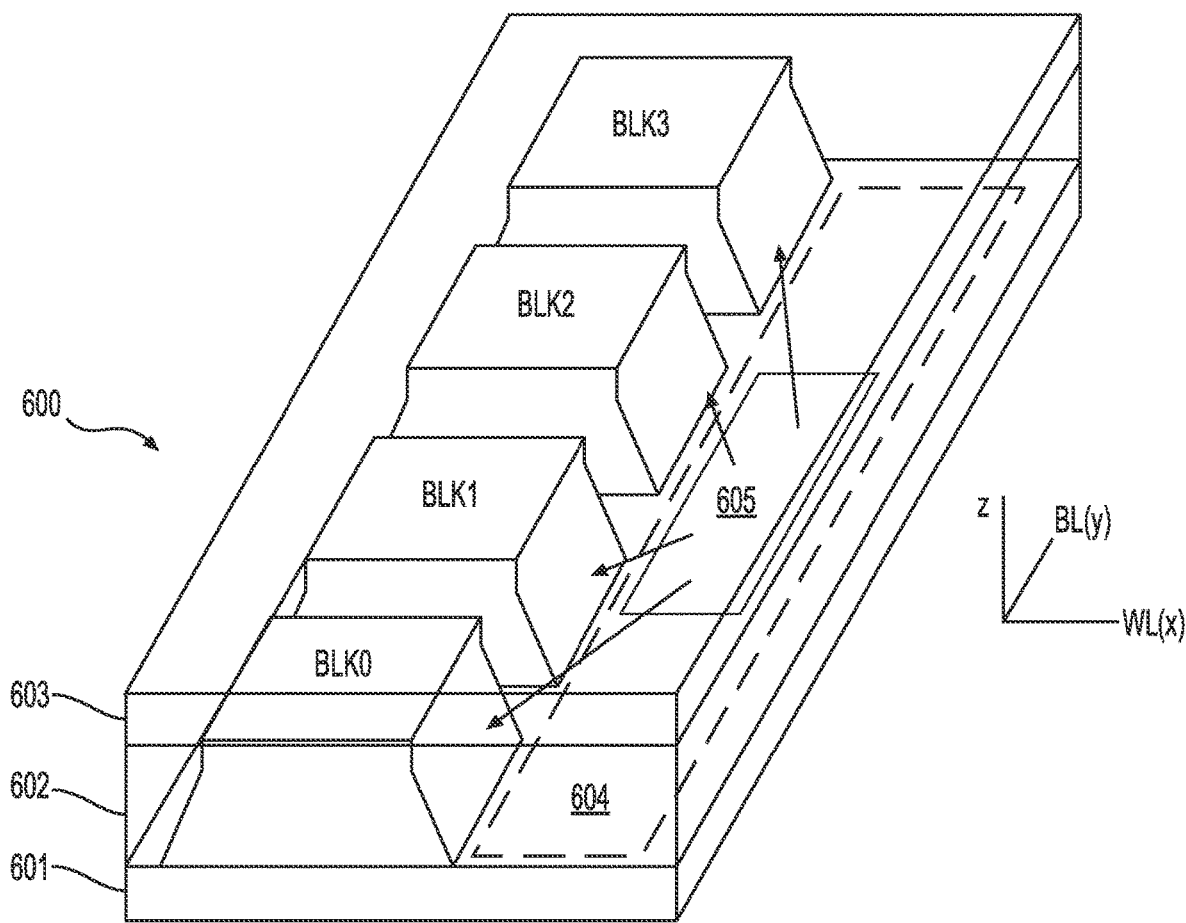
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
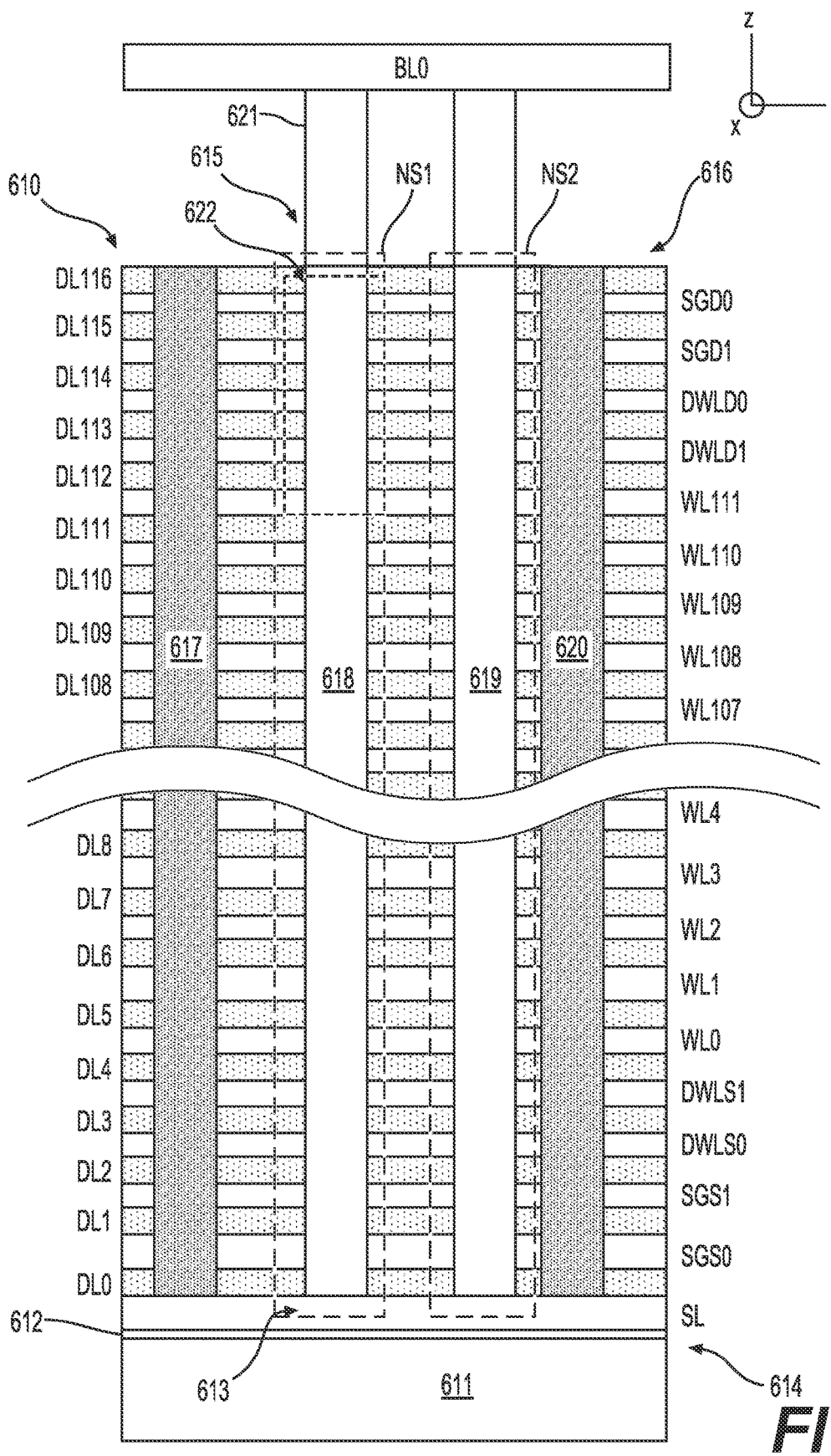
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
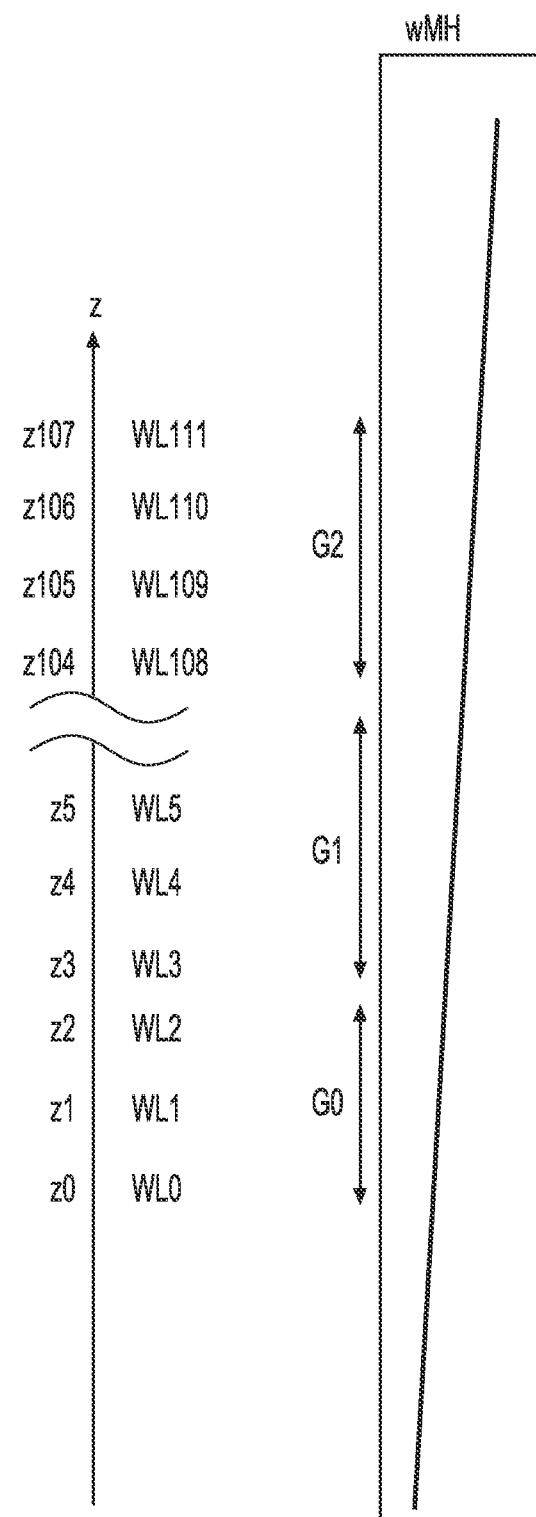
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z107 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
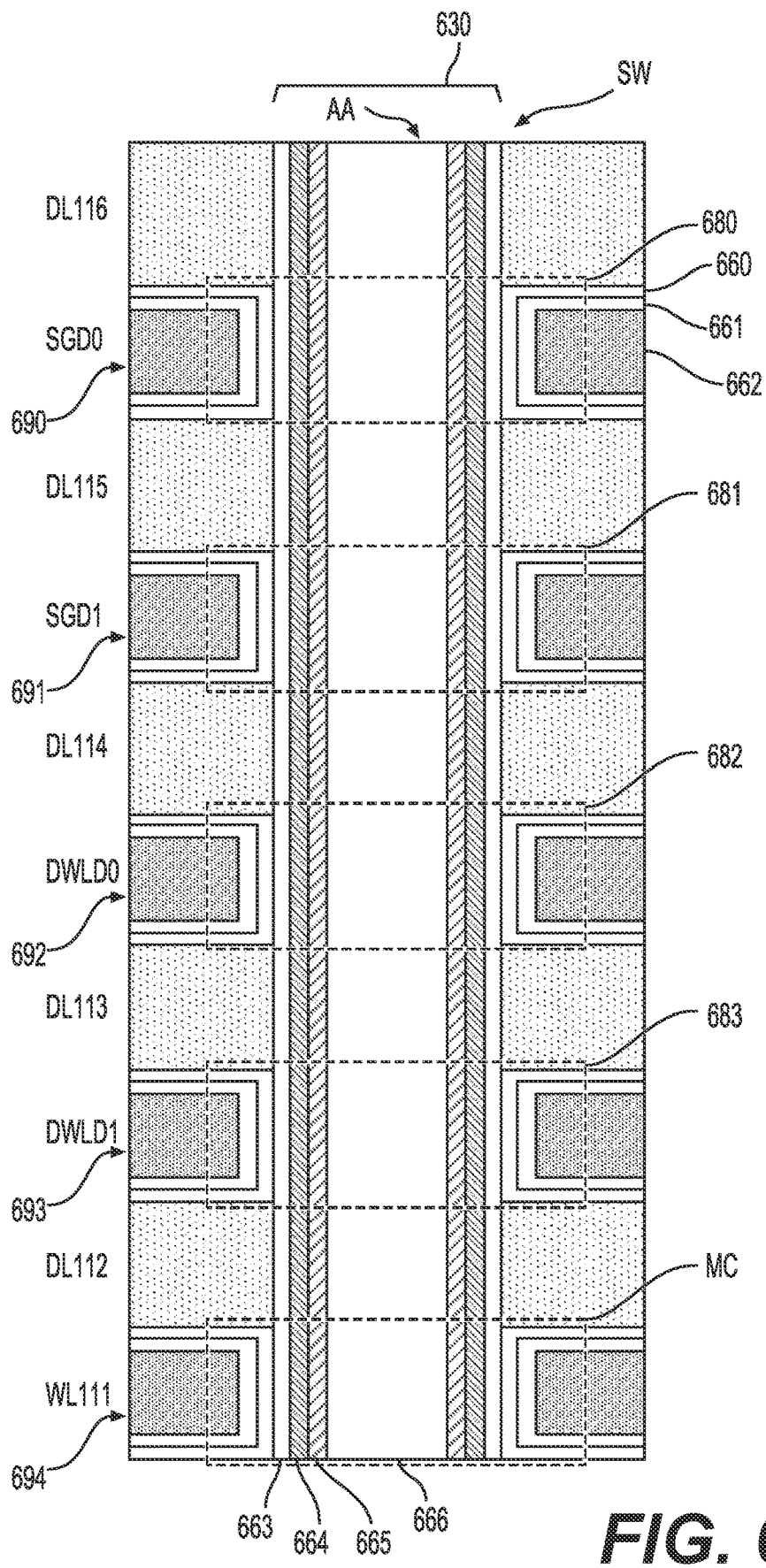
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
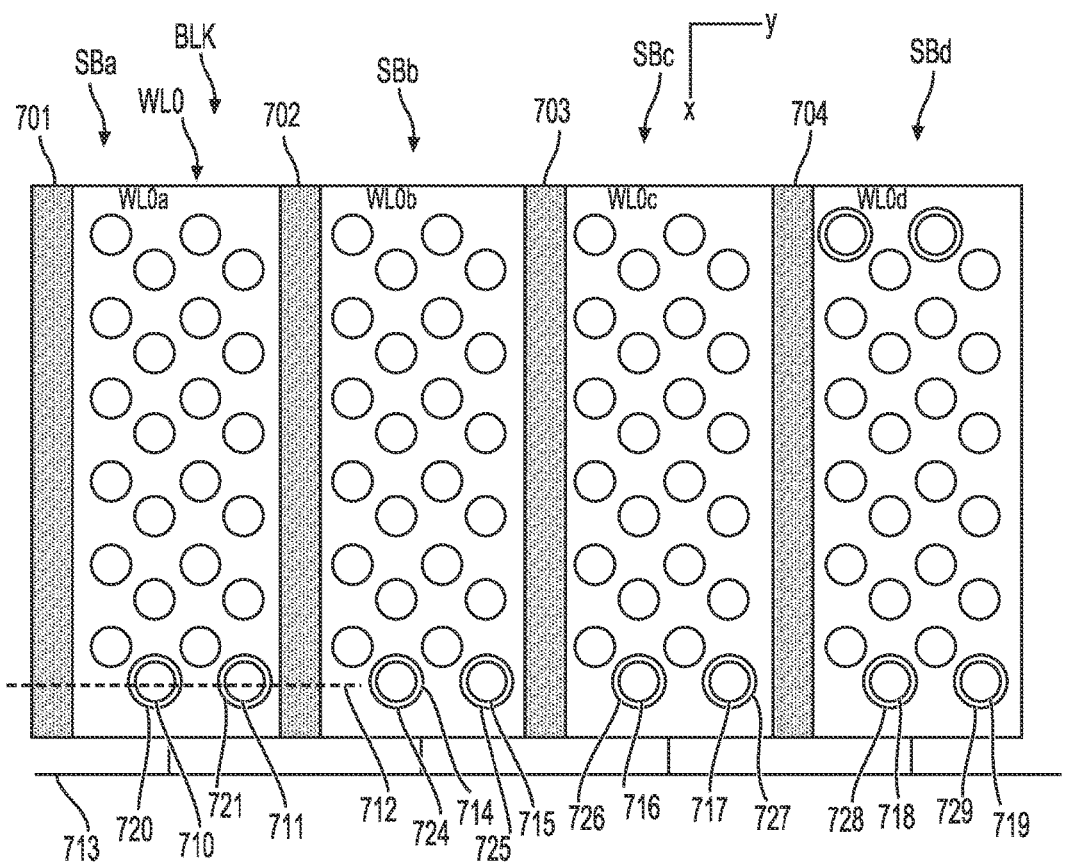
FIG. 7A depicts a top view of an example word line layer WL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
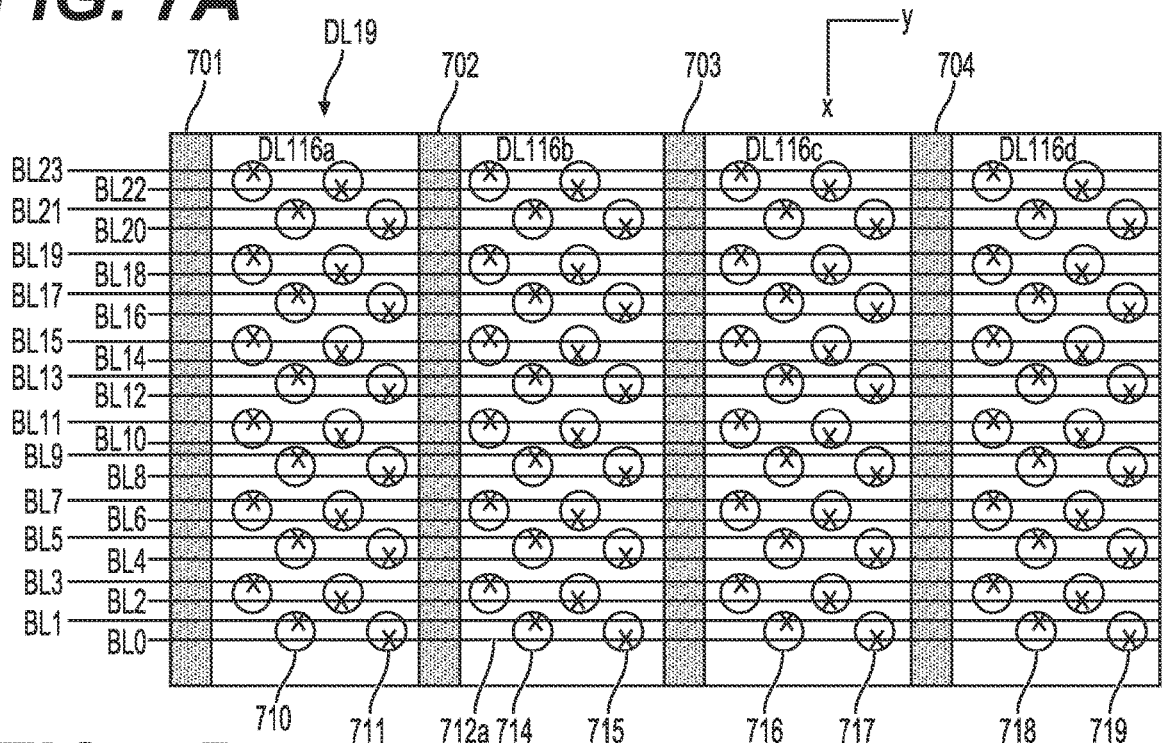
FIG. 7B depicts a top view of an example top dielectric layer DL19 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0*a*, WL0*b*, WL0*c* and WL0*d* which are each connected by a contact line 713. The last region of a word line layer in a block can be connected to a first region of a word line layer in a next block, in one approach. The contact line 713, in turn, is connected to a voltage driver for the word line layer. The region WL0*a* has example memory holes 710, 711 along a contact line 712. The region WL0*b* has example memory holes 714, 715. The region WL0*c* has example memory holes 716, 717. The region WL0*d* has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0*a*, memory cells 724, 725 are in WL0*b*, memory cells 726, 727 are in WL0*c*, and memory cells 728, 729 are in WL0*d*. These memory cells are at a common height in the stack.

Contact line connectors (e.g., slits, such as metal-filled slits) 701, 702, 703, 704 may be located between and adjacent to the edges of the regions WL0*a*-WL0*d*. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116*a*, DL116*b*, DL116*c* and DL116*d*. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116*a* has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

In a programming operation, the memory cells may be programmed to respective threshold voltages associated with programmed data states. To sense the data (such as during a verify or a read operation) contained in a memory cell, a sense amplifier may be discharged through the memory cell while a discharge time is monitored. Depending on the time it takes the sense amplifier to discharge from a charged voltage to a sense voltage will indicate the threshold voltage of the memory cell being sense.

Figure 8:
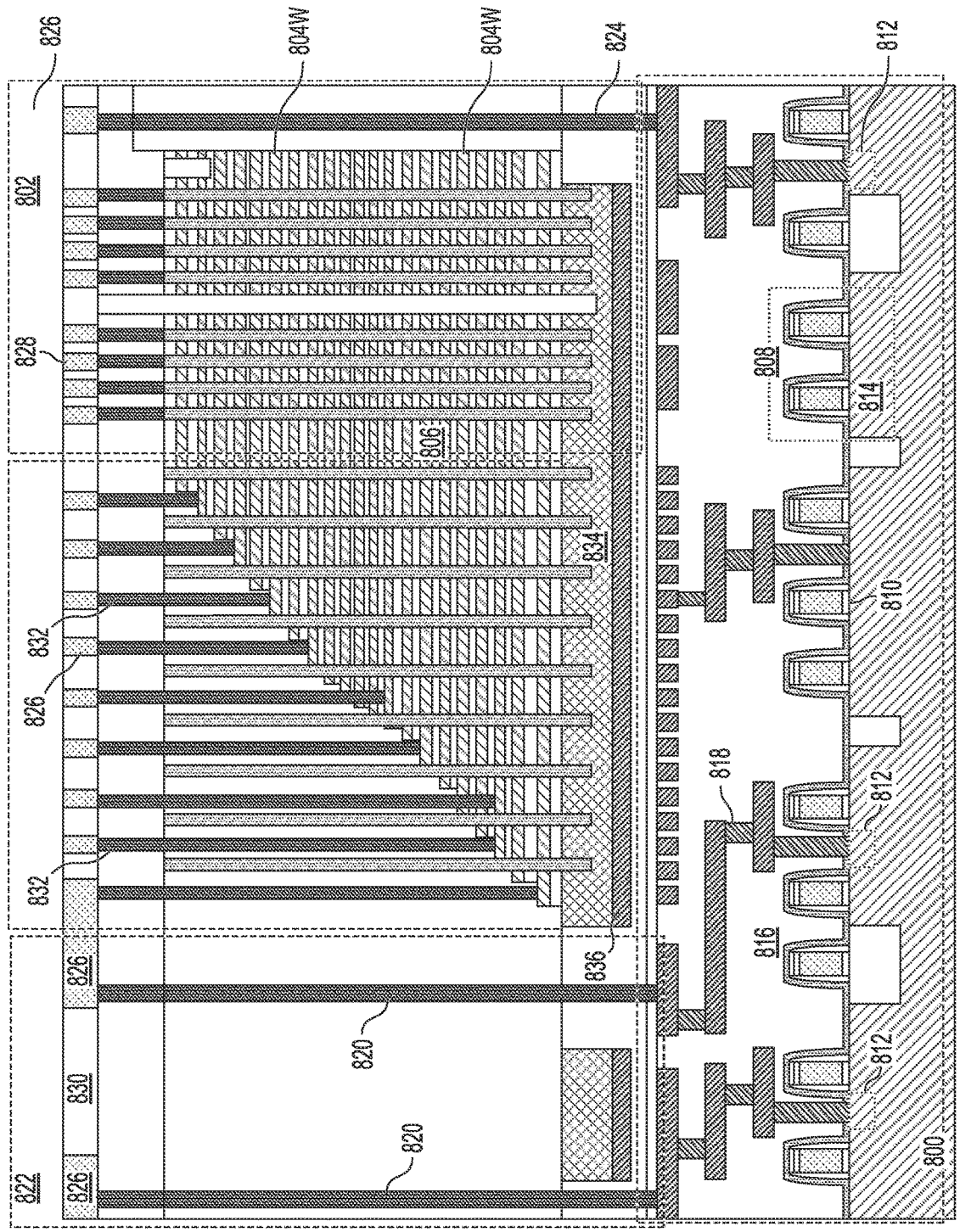
FIG. 8 schematically illustrates a memory block that has a CUA architecture.

Some memory devices have a CMOS under array ("CUA") architecture whereby peripheral circuitry (e.g., page buffers, sense amplifiers [SAs], charge pumps, etc.) are located underneath a vertical stack, or array, of memory cells as opposed to alongside the vertical stack. An example of a memory device with a CUA architecture is depicted in FIG. 8. In this example, the peripheral semiconductor devices 800 of the memory device are located under the memory array region 802 such that the word lines 804W and the memory opening fill structures 806 are located above the peripheral semiconductor devices 800.

Referring still to FIG. 8, the peripheral semiconductor devices 800 include driver circuit transistors 808 including a gate electrode structure 810, active regions 812 (i.e., source and drain regions) a semiconductor channel 814 located below the gate electrode structure 808. The peripheral semiconductor devices 800 also include lower-level dielectric material layers 816 and the lower-level metal interconnect structures 818 electrically connected to the nodes (e.g., gate electrode structures 810 and/or active regions 812) of the driver circuit transistors (e.g., CMOS type transistors) 808.

Peripheral-region contact via structures 820 in region 822 and/or through-memory-region via structures 824 in region 802 are formed in electrical contact with the lower-level metal interconnect structures 818. Interconnection line structures 826 and bit lines 828 are formed in interconnection level dielectric layer 830. The interconnection line structures 826 electrically connect the contact via structures 832 to the peripheral-region contact via structures 820 and/or the through-memory-region via structures 824. A horizontal source line 834 may include one or more doped polysilicon layers. An optional conductive plate 836, such as a metal or metal silicide plate, may be located in contact with the horizontal source line 834 for improved conductivity.

Another architecture, known as CBA (CMOS bonded to array), is similar to CUA, but the peripheral circuitry is located vertically above (as opposed to beneath) the array of memory cells. The following discussion is applicable to either chips having a CUA or a CBA architecture or any chip architecture where the peripheral circuitry overlaps with the array of memory cells.

Figure 9:
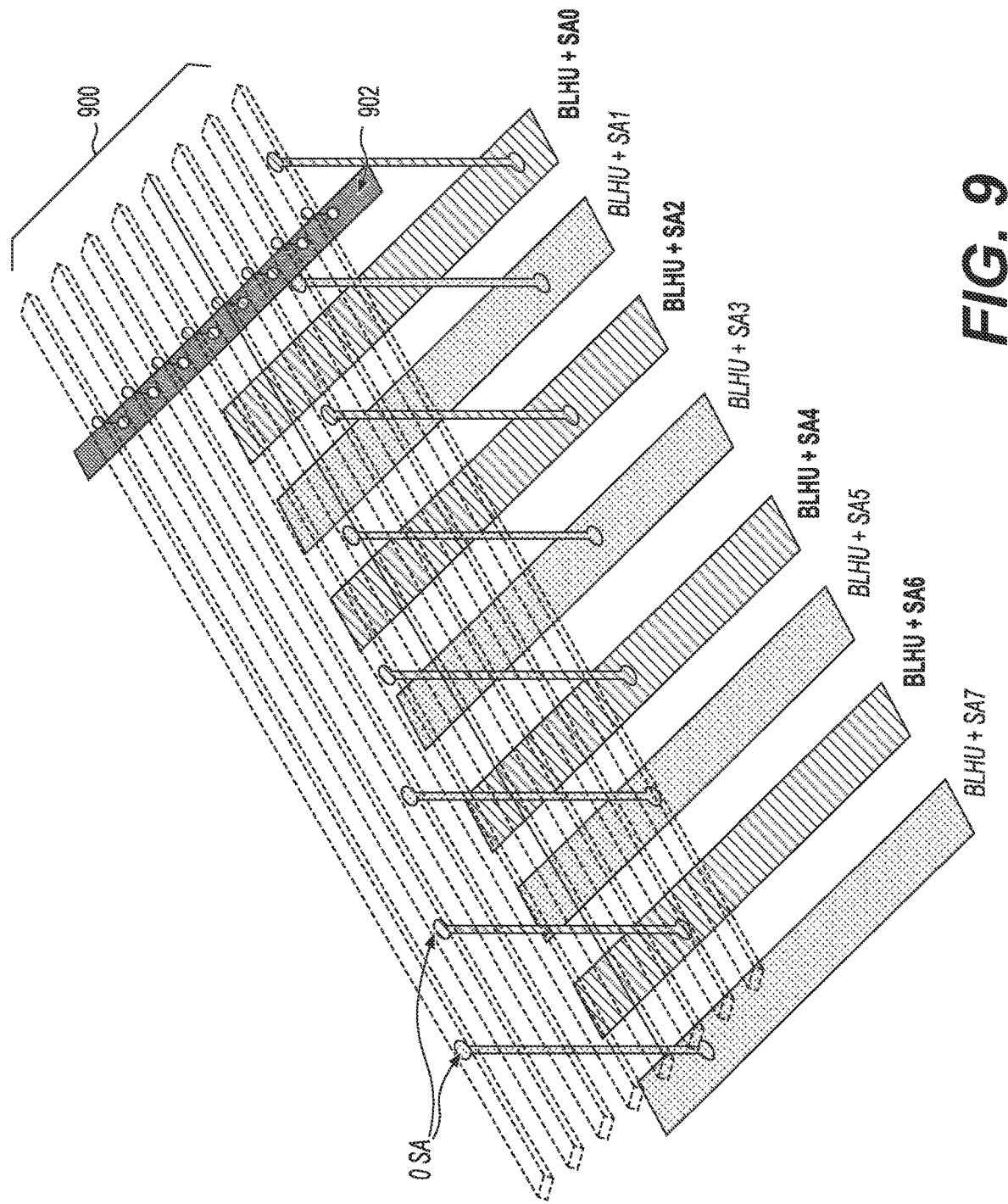
FIG. 9 is a schematic view of one type of chip of a memory device.

Turning now to FIG. 9, a schematic view of a die having a CUA or a CBA architecture is shown. In this schematic view, the bit lines 900 run in parallel with one another above the memory blocks 902, which contain the memory cells and run perpendicular to the bit lines. The circuitry (BLHU+SA0 through BLHU+SA7) may include bit line hook ups, sense amplifiers, data latches, and other peripheral circuitry. The sense amplifiers SA are spread out evenly across the entire chip. As illustrated, to fully spread the circuitry (BLHU+SA0 through BLHU+SA7) under the memory block 902 and achieve an optimized floorplan, different bit lines 900 have different contact locations with the circuitry (BLHU+SA0 through BLHU+SA7) with each bit line 900 being coupled to a unique sense amplifier SA. In this schematic view, only a fraction of each set of circuitry (BLHU+SA0 through BLHU+SA7), only a single block of many blocks 902, and only eight bit lines of many bit lines 900 are shown. From a NAND system usage perspective, a typical host request is eight kilobytes (8 KB) or four kilobytes (4 KB), but in some chips, the bit lines 900 for all sixteen kilobytes (16 KB) worth of blocks must be charged. Thus, there is waste because much of the data coupled to those bit lines is not being demanded.

Figure 10:
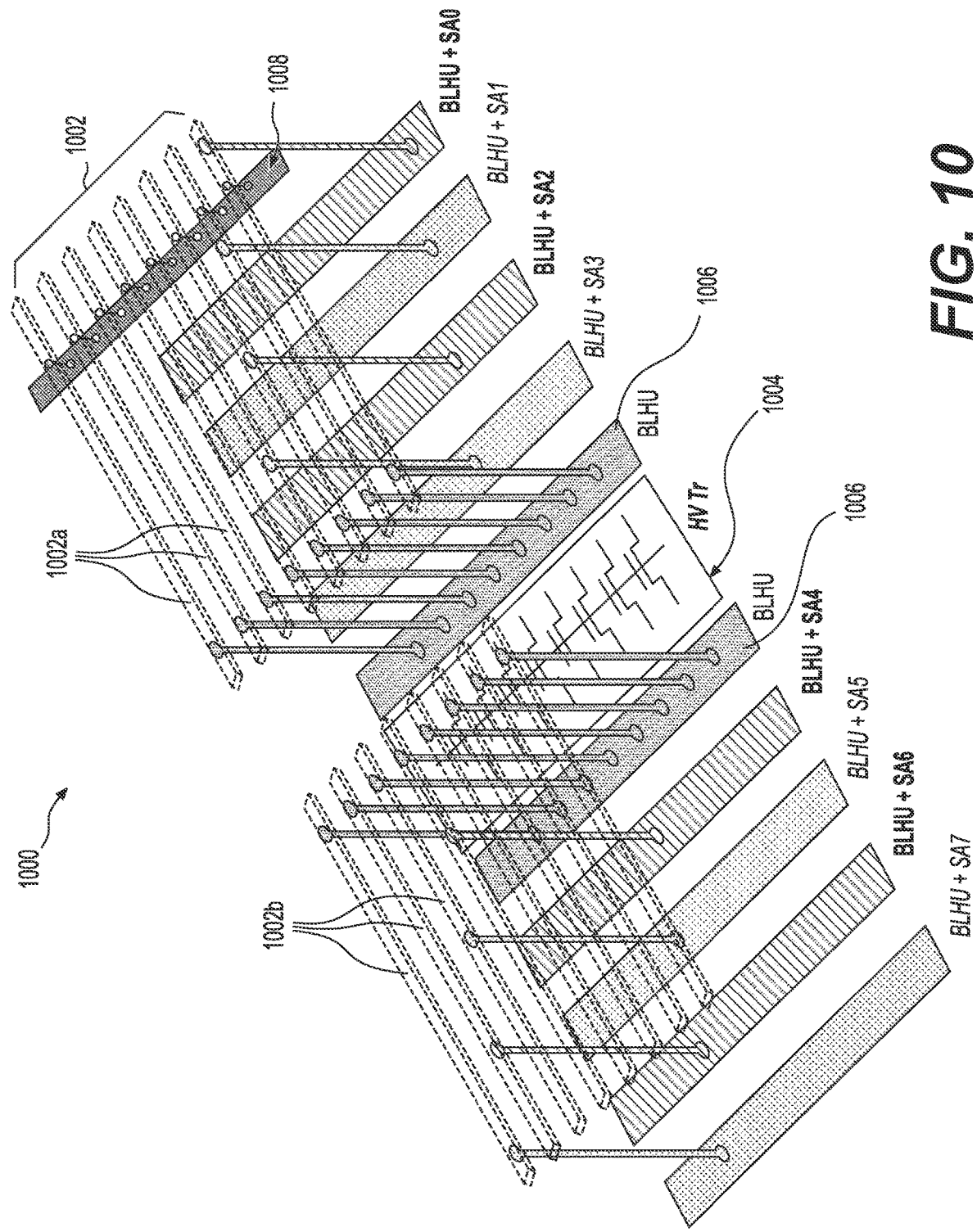
FIG. 10 is a schematic view of an exemplary embodiment of a chip constructed according to one aspect of the present disclosure.
Figure 11:
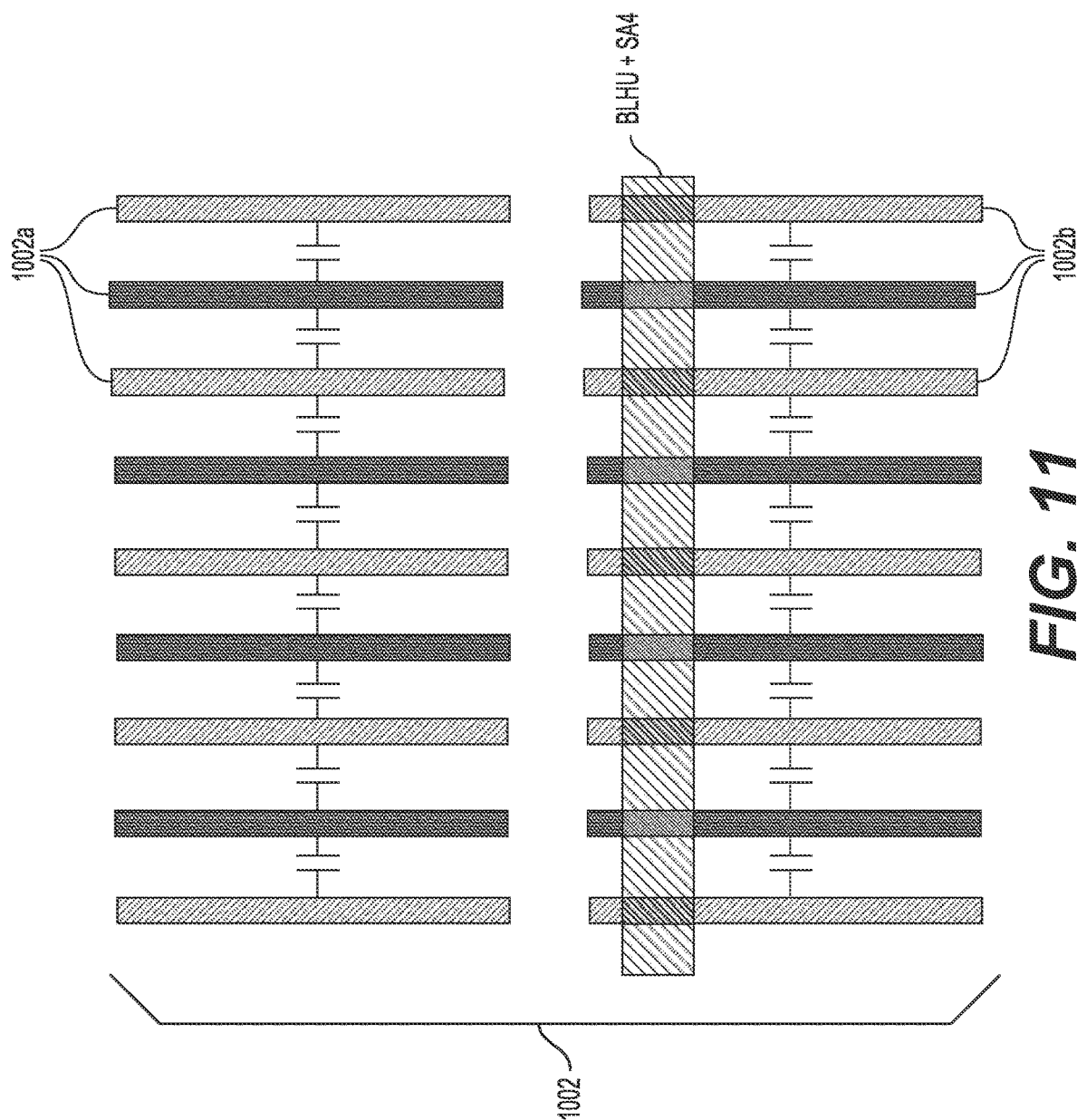
FIG. 11 is a schematic view illustrating the arrangement of the bit lines in the chip of FIG. 10.
Figure 12:
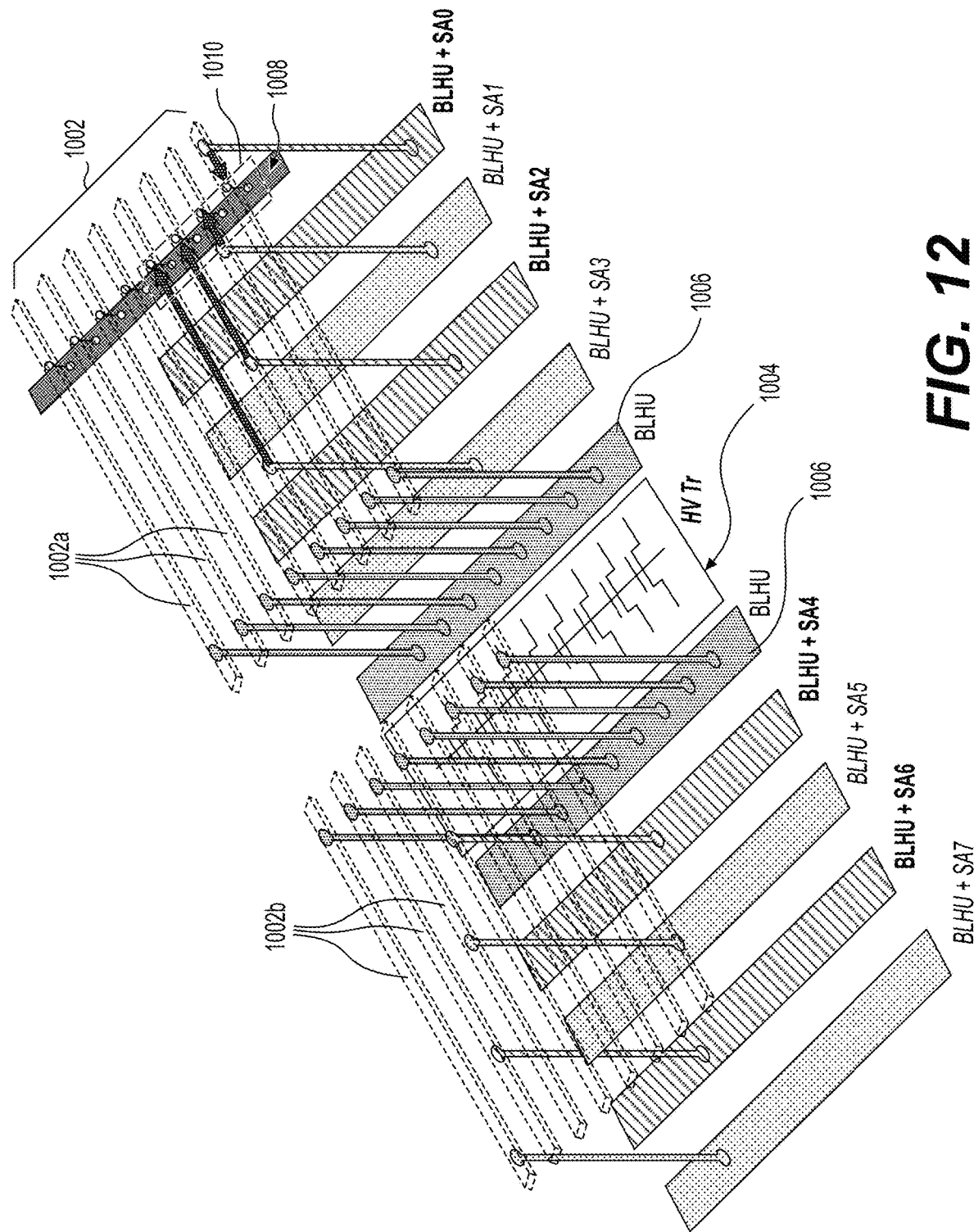
FIG. 12 is another schematic view of the chip of FIG. 10 during a sensing operation to sense one set of data.

Turning now to the schematic views of FIGS. 10-12, a chip 1000 constructed according to an exemplary embodiment of the present disclosure is shown. Rather than each bit line 1002 extending the continuously the length of the chip 100, in this case, there is a break in each bit line 1002, i.e., each bit line 1002 includes two portions 1002a, 1002b. The two portions 1002a, 1002b of each bit line 1002 are physically disconnected with from another but are electrically coupled together via a center switch transistor 1004. Specifically, a first portion 1002a of each of the bit lines 1002 is located on one side of the center switch transistor 1004, and a second portion 1002b of each bit line 1002 is located on an opposite side of the center switch transistor 1004. Some of the sense amplifiers SA are connected with the first portions 1002a of some of the bit lines 1002, and the other sense amplifiers SA are connected with the second portions 1002b of some of the bit lines 1002. Specifically, in this exemplary embodiment, sense amplifiers SA0-SA3 are connected with the first portions 1002a of four of the illustrated bit lines 1002, and sense amplifiers SA4-SA7 are connected with the second portions 1002b of the other four illustrated bit lines 1002. A set of additional bit line hook ups 1006 join the portions 1002a, 1002b of each bit line 1002 with the center switch transistors 1004. While only a single memory block 1008 is illustrated, it should be appreciated that many memory blocks, each containing an array of memory cells, may be included in the chip 1000.

As shown in FIG. 11, by separating each bit line 1002 into two detached portions 1002a, 1002b, the capacitance between adjacent bit lines 1002 is reduced as compared to bit lines that extend continuously the length of the chip. Further, since each bit line portion 1002a, 1002b is smaller than a non-broken bit line that extends continuously the length of the chip, its resistance is also reduced as compared to such a non-broken bit line. By reducing both the capacitance effect and the resistance, RC delay is reduced, thereby allowing charging and sensing to occur more quickly. Accordingly, performance during read is improved. In some cases, the reduction in charging time can be approximately seventy-five percent (75%) as compared to chips that have bit lines which extend continuously the length of the chip.

Turning back to FIG. 10, in many usage scenarios, the system does not need to access all of the data of the chip 1000. For example, in a chip 1000 where each memory block 1008 contains sixteen kilobytes (16 KB) of data, a read request from the system may be for only eight kilobytes (8 KB) of data on in one memory block 1008. In this case, the center switch transistors 1004 may be turned off so the portions 1002a, 1002b of each bit lines 1002 are disconnected from one another. The first portions 1002a that are coupled to sense amplifiers SA0-SA3 are activated, thereby reducing power consumption and bit line RC delay during a sensing operation. The second portions 1002b and the other first portions 1002a remain uncharged. In other words, all of the requested data is accessible without charging the entire memory block 1008.

Referring now to FIG. 12, in an example, the system requests only some of the data contained in the memory block 1008. Specifically, the data that's requested is contained in area 1010 of memory block 1008. By turning the center switch transistors 1004 off (a ground gate voltage is applied to the center switch transistors 1004), only the first portions 1002a of half the bit lines 1002 (specifically, the bit lines 1002 coupled with sense amplifiers SA0-SA3) are charged. With the appropriate ones of the first portions 1002a charged, the desired data contained in portion 1010 of the memory block 1008 can now be sensed. By only charging the first portions 1002a of some of the bit lines 1002, both the resistance of each charged bit line 1002 and the capacitance between adjacent bit lines 1002 is reduced, thereby both improving performance and reducing power consumption.

Figure 13:
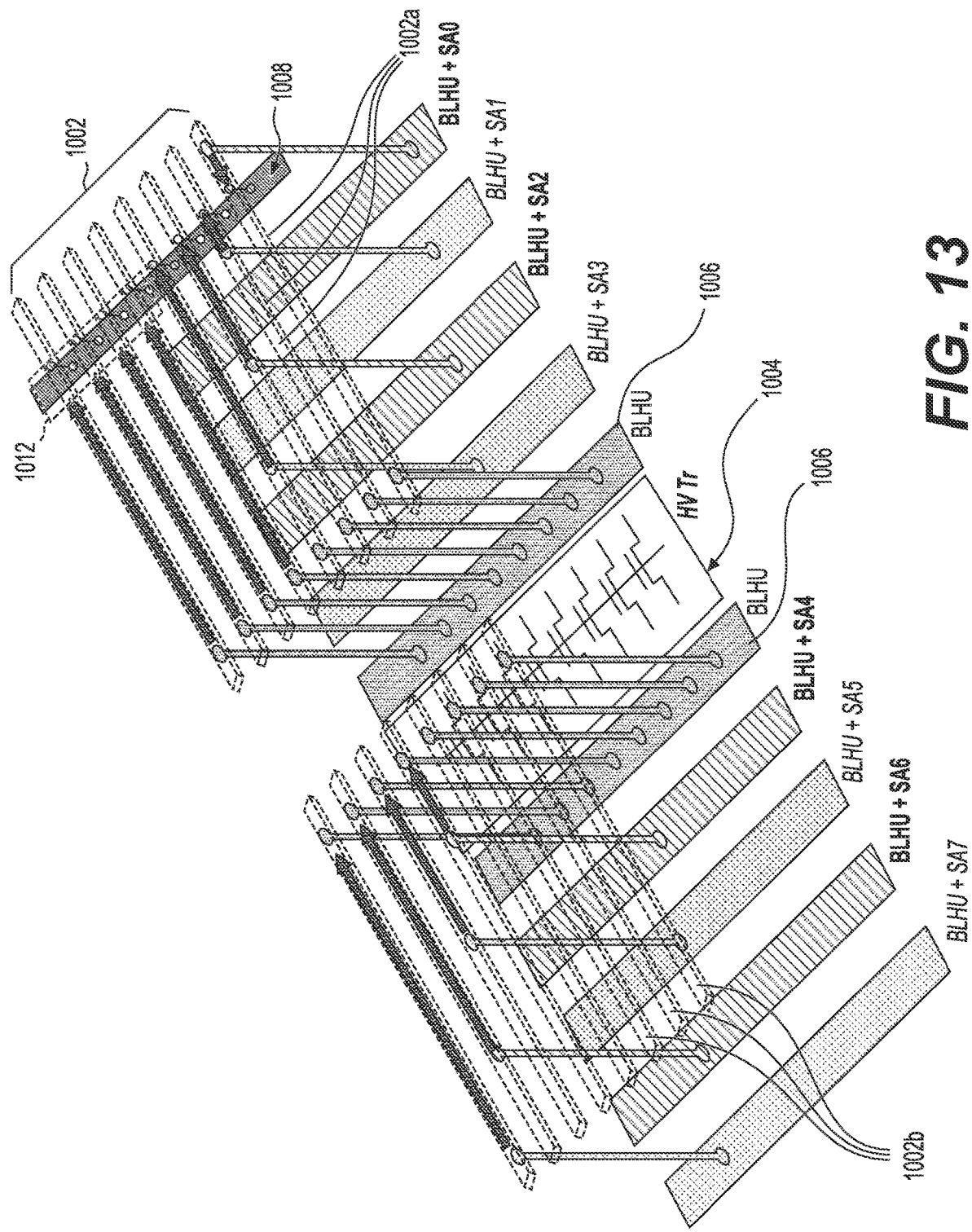
FIG. 13 is another schematic view of the chip of FIG. 10 during a sensing operation to sense a different set of data than depicted in FIG. 12.

Turning now to FIG. 13, in another example, the system requests only the data contained in portion 1012 of memory block 1002. In this case, the center switch transistors 1004 are turned on by applying a voltage to the center switch transistors 1004, thereby electrically connecting the two portions 1002a, 1002b of each bit line 1002 with one another. All of the sense amplifiers SA0-SA7 charge the full lengths of the bit lines 1002 (both the first portions 1002a and the second portions 1002b) so that the requested data can be accessed. Similarly, if all of the data of the memory block 1008 is requested by the system, the center switch transistors 1004 are also turned on to charge both portions of all of the bit lines 1002.

Figure 14:
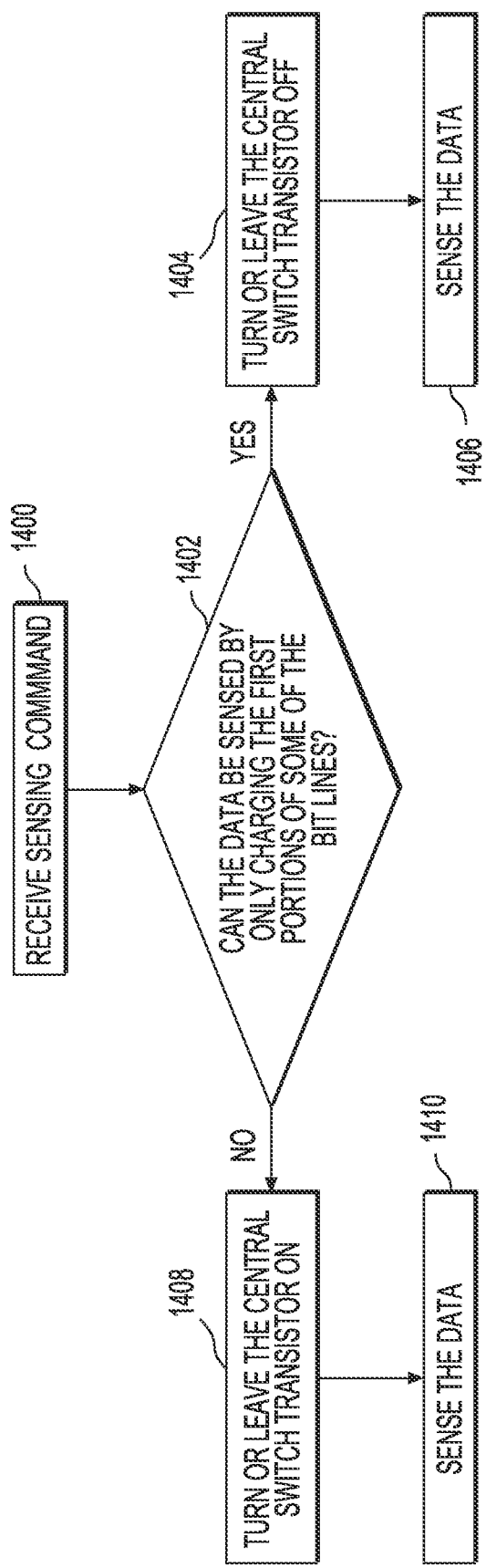
FIG. 14 is a flow chart depicting the steps of sensing data in a chip according to an exemplary embodiment.

Referring now to FIG. 14, a flow chart depicting the steps of an exemplary embodiment of a sensing operation are depicted. At step 1400, a controller 1400 receives a command to sense data from a chip, such as the chip 1000 depicted in FIGS. 10, 12, and 13 discussed above.

At decision step 1402, it is determined if the data can be sensed by only charging the first portions 1002a of some of the bit lines 1200. In the embodiment of FIG. 12, the answer at decision step 1402 would be yes if the data to be sensed is contained in area 1010 of memory block 1008.

If the answer at decision step 1402 is yes, then the method continues with the step 1402 of either leaving the central switch transistor 1004 off or turning the central switch transistor 1004 off. At step 1406, the controller senses the data. The sensing operation may include discharging a sense amplifier SA through a memory cell of the memory block 1008 while monitoring the discharge time to determine a threshold voltage of the memory cell.

If the answer at decision step 1402 is no, then the method continues with the step 1408 of either leaving the central switch transistor 1004 on or turning the central switch transistor 1004 on. At step 1410, the controller senses the data.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory device, comprising:
   a chip including circuitry and a plurality of memory blocks containing an array of memory cells and a plurality of bit lines, the circuitry overlying or underlying the array of memory cells;
   the bit lines of the memory blocks being divided into first and second portions that are electrically connected with one another via at least one transistor so that at least one of the first and second portions of each bit line can be charged independently of the other portion of the same bit line; and
   a controller configured to
   receive a command to sense data from the chip,
   determine whether the data can be sensed from the chip by charging only the first portion,
   in response to a determination that the data can be sensed by charging only the first portion, put the at least one transistor in an off condition so only the first portion of at least some of the bit lines is charged during a sensing operation, and
   in response to a determination that the data cannot be sensed by charging only the first portion, put the at least one transistor in an on condition so that both the first and second portions of each bit line are charged,
   wherein the first portions are located on one side of the at least one transistor and the second portions are located on an opposite side of the at least one transistor, and
   wherein (i) the circuitry includes a plurality of sense amplifiers that are in electrical communication with the bit lines, (ii) some of the sense amplifiers are electrically connected with the first portions of one or more of the plurality of bit lines, and (iii) others of the sense amplifiers are electrically connected with the second portions of one or more of the plurality of bit lines.

2. The memory device as set forth in claim 1 wherein each of the first and second portions of each bit line are coupled to the at least one transistor by a corresponding bit line hook up.

3. The memory device as set forth in claim 1 wherein the circuitry is located vertically below the plurality of memory blocks.

4. A method of operating a memory device, the method comprising the steps of:
   preparing a chip including circuitry and a plurality of memory blocks containing an array of memory cells and a plurality of bit lines, the circuitry overlying or underlying the array of memory cells, and the bit lines of the memory blocks being divided into first and second portions that are electrically connected with one another via at least one transistor so that at least one portion of each bit line can be charged independently of the other portion of the same bit line;
   receiving a command to sense data contained in a memory block of the plurality of memory blocks;

determining whether the data can be sensed from the memory block by charging only the first portion;

in response to a determination that the data in the memory block can be sensed by charging only the first portion, putting the at least one transistor in an off condition and charging only the first portion of at least some of the bit lines; and in response to a determination that the data in the memory block cannot be sensed by charging only the first portion, putting the at least one transistor in an on condition and charging both the first and second portions of each bit line, wherein the first portions are located on one side of the at least one transistor and the second portions are located on an opposite side of the at least one transistor, and wherein (i) the circuitry includes a plurality of sense amplifiers that are in electrical communication with the bit lines, (ii) some of the sense amplifiers are electrically connected with the first portions of one or more of the plurality of bit lines, and (iii) others of the sense amplifiers are electrically connected with the second portions of one or more of the plurality of bit lines.

5. The method as set forth in claim 4 wherein the circuitry is located vertically below the plurality of memory blocks.

6. The method as set forth in claim 4 wherein each of the first and second portions of each bit line are coupled to the at least one transistor by a corresponding bit line hook up.

* * * * *